(12) United States Patent
Stagarescu et al.

(10) Patent No.: US 9,401,582 B2
(45) Date of Patent: Jul. 26, 2016

(54) LASERS WITH BEAM-SHAPE MODIFICATION

(71) Applicant: M/A-COM TECHNOLOGY SOLUTIONS HOLDINGS, INC., Lowell, MA (US)

(72) Inventors: Cristian Stagarescu, Ithaca, NY (US); Alex A. Behfar, Keswick, VA (US); Norman Sze-keung Kwong, San Marino, CA (US)

(73) Assignee: M/A-COM TECHNOLOGY SOLUTIONS HOLDINGS, INC., Lowell, MA (US)

(*) Notice: Subject to any disclaimer, the term of this patent is extended or adjusted under 35 U.S.C. 154(b) by 0 days.

(21) Appl. No.: 13/889,207

(22) Filed: May 7, 2013

(65) Prior Publication Data

US 2013/0301666 A1   Nov. 14, 2013

Related U.S. Application Data

(60) Provisional application No. 61/644,270, filed on May 8, 2012.

(51) Int. Cl.
| | |
|---|---|
| *H01S 5/00* | (2006.01) |
| *H01S 5/30* | (2006.01) |
| *H01S 5/02* | (2006.01) |
| *H01S 5/026* | (2006.01) |
| *B82Y 20/00* | (2011.01) |
| *H01S 5/022* | (2006.01) |
| *H01S 5/22* | (2006.01) |

(Continued)

(52) U.S. Cl.
CPC .............. *H01S 5/3013* (2013.01); *B82Y 20/00* (2013.01); *H01S 5/0207* (2013.01); *H01S 5/0267* (2013.01); *H01S 5/0217* (2013.01); *H01S 5/02212* (2013.01); *H01S 5/02236* (2013.01); *H01S 5/02248* (2013.01); *H01S 5/02284* (2013.01); *H01S 5/1085* (2013.01); *H01S 5/22* (2013.01); *H01S 5/34326* (2013.01); *H01S 2301/18* (2013.01)

(58) Field of Classification Search
CPC . H01S 5/02208; H01S 5/0207; H01S 5/3013; H01S 5/0267; H01S 5/0217; H01S 5/02212; H01S 5/02236; H01S 5/02248; H01S 5/02284; H01S 5/1085; H01S 5/22; H01S 5/34326; H01S 2301/18; B82Y 20/00
USPC ............................ 372/44.01, 29.014, 93, 99
See application file for complete search history.

(56) References Cited

U.S. PATENT DOCUMENTS

| | | |
|---|---|---|
| 4,773,077 A | 9/1988 | Yamamoto et al. |
| 4,851,368 A | 7/1989 | Behfar-Rad et al. |

(Continued)

OTHER PUBLICATIONS

International Search Report Corresponding to PCT/US2013/039971, dated Sep. 6, 2013, 5 pages.

(Continued)

*Primary Examiner* — Tod T Van Roy
*Assistant Examiner* — Vu A Vu
(74) *Attorney, Agent, or Firm* — Wilmer Cutler Pickering Hale and Dorr LLP

(57) ABSTRACT

A beam control structure for semiconductor lasers that allows modification of the shape of a beam allowing, for example, higher coupling into an optical fiber. The structure may comprise one or more of a tilted patio, a staircase, a reflective roof, and a reflective sidewall.

21 Claims, 8 Drawing Sheets

(51) Int. Cl.
*H01S 5/343* (2006.01)
*H01S 5/10* (2006.01)

(56) References Cited

U.S. PATENT DOCUMENTS

| | | | |
|---|---|---|---|
| 5,032,879 A | | 7/1991 | Buchmann et al. |
| 5,100,220 A | * | 3/1992 | Voegeli ............................ 385/14 |
| 5,357,123 A | * | 10/1994 | Sugawara ......................... 257/88 |
| 5,627,851 A | * | 5/1997 | Takahashi ................... 372/44.01 |
| 5,680,384 A | * | 10/1997 | Seki et al. ................. 369/112.29 |
| 5,894,492 A | * | 4/1999 | Welch et al. ................... 372/50.1 |
| 6,449,296 B1 | | 9/2002 | Hamasaki et al. |
| 7,024,077 B2 | * | 4/2006 | Nagano ............................ 385/39 |
| 7,245,645 B2 | * | 7/2007 | Behfar et al. ................. 372/50.1 |
| 7,326,946 B2 | * | 2/2008 | Watanabe ....................... 250/551 |
| 7,543,999 B2 | * | 6/2009 | Winter et al. ..................... 385/93 |
| 8,787,418 B2 | | 7/2014 | Shur et al. |
| 2003/0063643 A1 | | 4/2003 | Yoshida et al. |
| 2004/0233950 A1 | | 11/2004 | Furukawa et al. |
| 2005/0157770 A1 | | 7/2005 | Behfar et al. |
| 2005/0175053 A1 | | 8/2005 | Kimura et al. |
| 2005/0254539 A1 | * | 11/2005 | Klimek .................. G02B 6/102 372/50.12 |
| 2006/0118893 A1 | | 6/2006 | Behfar et al. |
| 2007/0040268 A1 | * | 2/2007 | Sherrer et al. ................. 257/712 |
| 2007/0047609 A1 | * | 3/2007 | Francis et al. .............. 372/50.21 |
| 2007/0217476 A1 | | 9/2007 | Yoshikawa et al. |
| 2008/0203897 A1 | * | 8/2008 | De Samber et al. .......... 313/498 |
| 2010/0091811 A1 | * | 4/2010 | Behfar et al. .............. 372/50.23 |
| 2011/0134948 A1 | * | 6/2011 | Kawakami et al. .............. 372/34 |
| 2011/0170569 A1 | * | 7/2011 | Tyagi ..................... B82Y 20/00 372/45.013 |
| 2012/0281727 A1 | * | 11/2012 | Fang et al. .................. 372/46.01 |
| 2013/0148684 A1 | * | 6/2013 | Guo ...................... H01S 5/4043 372/50.12 |

OTHER PUBLICATIONS

Written Opinion Corresponding to PCT/US2013/039971, dated Sep. 6, 2013, 11 pages.

A. Behfar-Rad, et al. "Monolithic AlGaAs-GaAs Single Quantum-Well Ridge Lasers Fabricated with Dry-Etched Facets and Ridges", IEEE Journal of Quantum Electronics, vol. 28, No. 5, pp. 1227-1231, May 1992.

Y. Itaya, et al. "Spot-Size Converter Integrated Laser Diodes (SS-LD's)," IEEE Journal of Selected Topics in Quantum Electronics, vol. 3, No. 3, pp. 968-974, Jun. 1997.

I. Moerman, et al. "A Review on Fabrication Technologies for the Monolithic Integration of Tapers with III-V Semiconductor Devices", IEEE Journal of Selected Topics in Quantum Electronics, vol. 3, No. 6, pp. 1308-1320, Dec. 1997.

H. Yamazaki, et al. "1.3-µm Spot-Size-Converter Integrated Laser Diodes Fabricated by Narrow-Stripe Selective MOVPE", IEEE Journal of Selected Topics in Quantum Electronics, vol. 3, No. 6, pp. 1392-1398, Dec. 1997.

European Supplementary Search Report issued in 13787334.5, mailed Apr. 4, 2016 (6 pages).

* cited by examiner

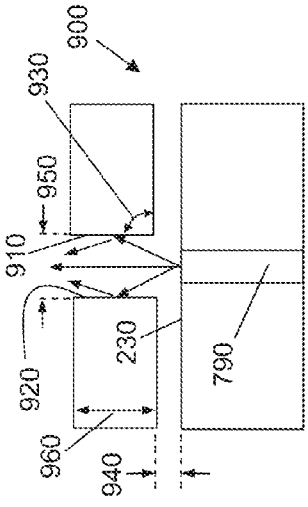
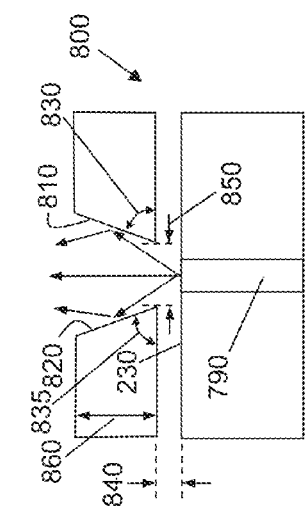
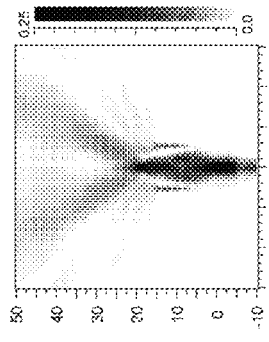
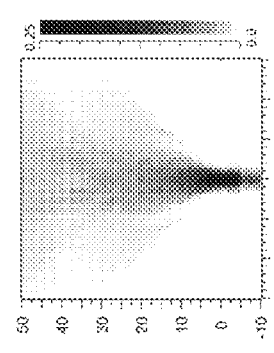
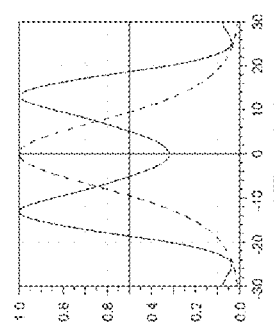
Figure 8(a)
Figure 8(b)
Figure 8(c)
Figure 9(a)
Figure 9(b)
Figure 9(c)

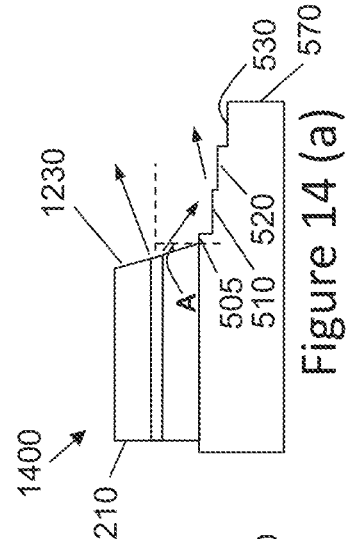
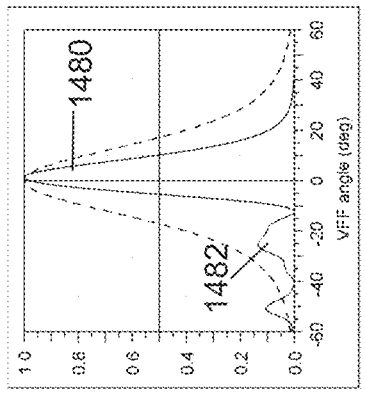
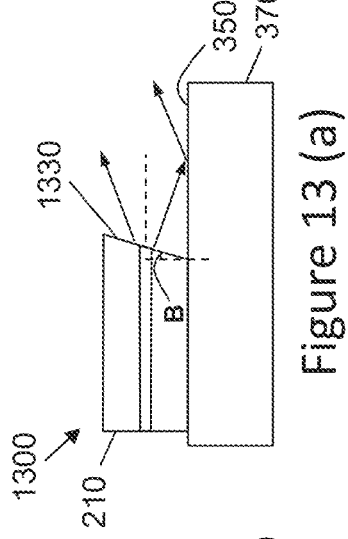
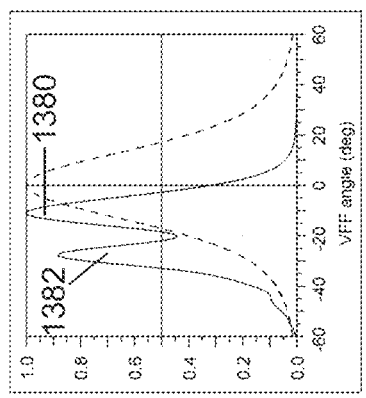
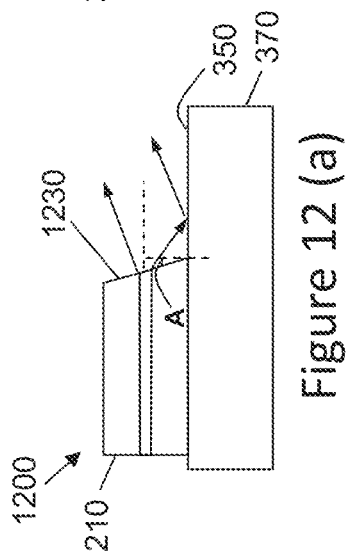
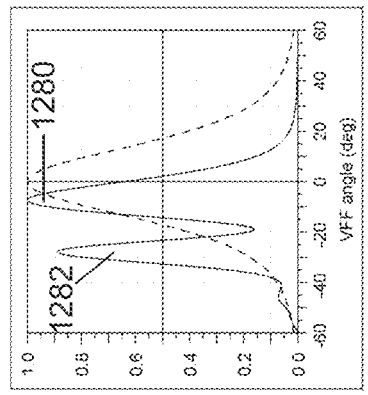

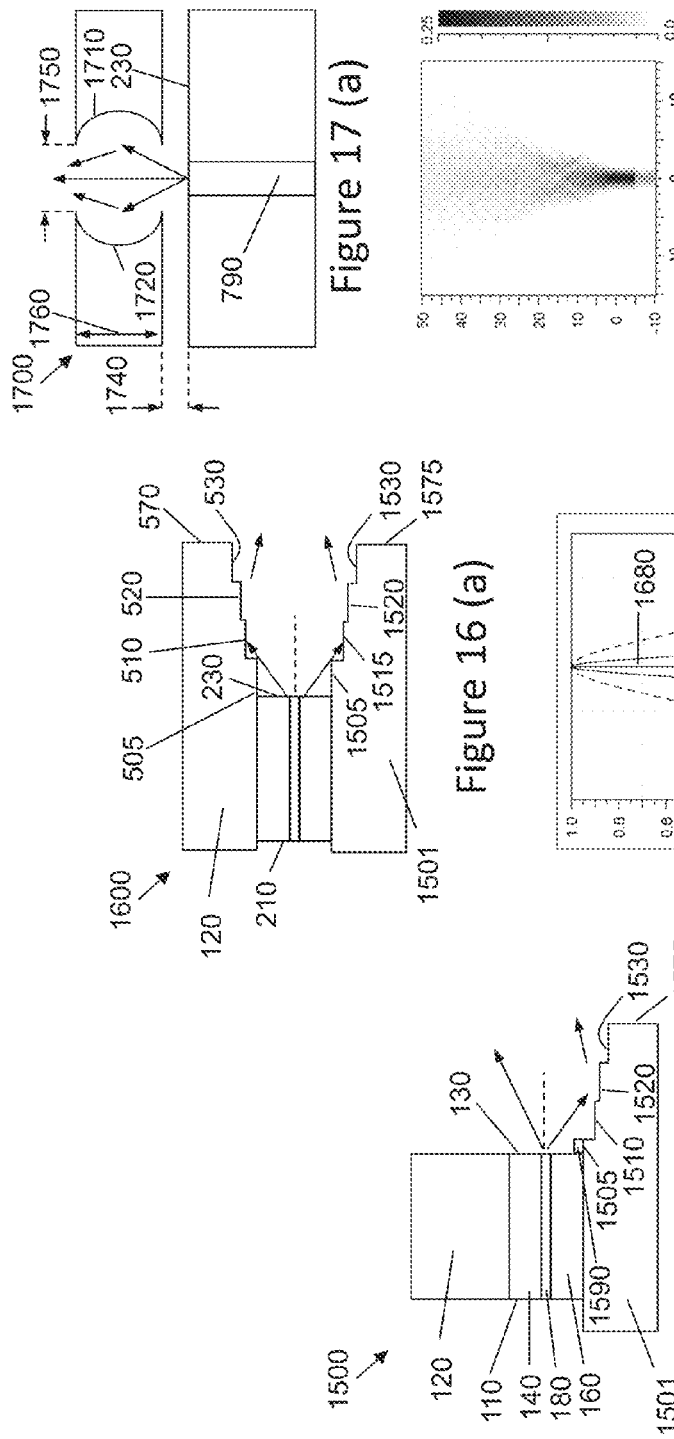

LASERS WITH BEAM-SHAPE MODIFICATION

CROSS-REFERENCE TO RELATED APPLICATIONS

This patent application claims priority to U.S. Provisional Patent Application No. 61/644,270, filed May 8, 2012, which is hereby incorporated by reference herein in its entirety.

BACKGROUND OF THE DISCLOSURE

The present disclosure relates, in general, to photonic devices, and more particularly to improved photonic devices and methods for fabricating them.

Semiconductor lasers typically are fabricated on a wafer by growing an appropriate layered semiconductor material on a substrate through Metalorganic Chemical Vapor Deposition (MOCVD) or Molecular Beam Epitaxy (MBE) to form an epitaxial structure having an active layer parallel to the substrate surface. The wafer is then processed with a variety of semiconductor processing tools to produce a laser optical cavity incorporating the active layer and incorporating metallic contacts attached to the semiconductor material. Laser facets are typically formed at the ends of the laser cavity by cleaving the semiconductor material along its crystalline structure to define edges, or ends, of the laser optical cavity so that when a bias voltage is applied across the contacts, the resulting current flow through the active layer causes photons to be emitted out of the faceted edges of the active layer in a direction perpendicular to the current flow. Since the semiconductor material is cleaved to form the laser facets, the locations and orientations of the facets are limited; furthermore, once the wafer has been cleaved, typically it is in small pieces so that conventional lithographical techniques cannot readily be used to further process the lasers.

The foregoing and other difficulties resulting from the use of cleaved facets led to the development of a process for forming the facets of semiconductor lasers through etching. This process, as described in U.S. Pat. No. 4,851,368, also allows lasers to be monolithically integrated with other photonic devices on the same substrate, the disclosure of which is hereby incorporated herein by reference. This work was further extended and a ridge laser process based on etched facets was disclosed in the IEEE Journal of Quantum Electronics, volume 28, No. 5, pages 1227-1231, May 1992.

One of the major challenges in the use of semiconductor lasers is the mismatch between the output beam from the laser and the medium to which the beam is directed or coupled. For example, forming a semiconductor laser with spot size converters (SSC) can allow more efficient coupling of the laser light to an optical fiber or expand the tolerance for optical alignment, however, in general there are certain disadvantages that come along with forming SSC, such as process complexity and degradation in laser characteristics. An example of the degradation in laser characteristics is the increase in the laser threshold current. The following publications discuss the various SSC approaches employed: "Spot-Size Converter Integrated Laser Diodes (SS-LD's)" by Itaya, et al., IEEE Journal of Selected Topics in Quantum Electronics, Volume 3, Number 3, pages 968-974; "A Review on Fabrication Technologies for the Monolithic Integration of Tapers with III-V Semiconductor Devices" by Moerman, et al., IEEE Journal of Selected Topics in Quantum Electronics, Volume 3, Number 6, pages 1308-1320; and "1.3-µm Spot-Size-Converter Integrated Laser Diodes Fabricated by Narrow-Stripe Selective MOVPE" by Yamazaki, et al., IEEE Journal of Selected Topics in Quantum Electronics, Volume 3, Number 6, pages 1392-1398.

A laser structure formed through a simple process that allows beam modification without significant impact to laser characteristics, such as laser threshold, is very desirable, and, for example, can lead to very efficient coupling of the laser beam into an optical fiber with low cost packaging.

SUMMARY OF THE DISCLOSURE

According to the present disclosure, a semiconductor laser is formed that allows modification of its output beam.

In one embodiment of the present disclosure, the vertical far-field of the laser is modified using an etched facet laser with a patio having a tilted angle or a staircase in front of the output facet. In another embodiment of the present disclosure, sidewalls are used to modify the horizontal far-field of the laser in addition to the patio with the tilted angle or staircase. In yet another embodiment, a roof is provided to modify the vertical far-field of the laser. In yet another embodiment, a cleaved or etched facet laser is mounted active-side down on a substrate or base such as silicon or aluminum nitride (AlN) with structures such as a tilted patio or staircase.

For instance, in one embodiment of the present disclosure, a semiconductor chip is disclosed comprising: a substrate; an epitaxial laser on said substrate; an etched facet; and a structure adjacent said etched facet, said structure being a patio having one of a downwardly tilt and a downwards staircase having at least one step. The semiconductor chip may also comprise reflective sidewalls. The semiconductor chip may further comprise a roof in front of said etched facet, wherein said roof has a lower reflective surface closer to the highest point of said etched facet than the lowest point of said etched facet. The semiconductor chip may additionally comprise a reflective coating deposited on said structure. The semiconductor chip may still further comprise said substrate being selected from the group comprising InP, GaAs, and GaN.

In another embodiment of the present disclosure, a semiconductor chip is disclosed comprising: a substrate; an epitaxial laser on said substrate; an etched facet; and a roof in front of said etched facet, wherein said roof has a lower reflective surface closer to a highest point of said etched facet than a lowest point of said etched facet. The semiconductor chip may also comprise reflective sidewalls. The semiconductor chip may further comprise said substrate being selected from the group comprising InP, GaAs, and GaN.

In yet another embodiment of the present disclosure, a semiconductor chip is disclosed comprising: a substrate; an epitaxial laser on said substrate; an etched facet having an angle other than 90° to a plane of the substrate; a laser beam impinging on said etched facet below a critical angle of said etched facet; and a reflective structure adjacent said etched facet. The semiconductor chip may also comprise said structure being a titled patio. The semiconductor chip may further comprise reflective sidewalls, wherein said sidewalls may be separated from said etched facet with a gap. The semiconductor chip may additionally comprise said structure being a staircase containing at least one step. The semiconductor chip may still further comprise said substrate being selected from the group comprising InP, GaAs, and GaN.

In yet another embodiment of the present disclosure, a hybrid assembly is disclosed comprising: a base with a reflective surface of a patio having one of a downwardly tilt and a downwards staircase with at least one step; and a laser with an active layer and at least one facet positioned active-side down on said base; wherein said at least one facet is positioned adjacent to said reflective surface. The hybrid assembly may also comprise said base being either AlN or Si. The hybrid assembly may further comprise said at least one facet being an etched facet, further comprising a reflective structure adjacent said etched facet. The hybrid assembly may additionally comprise said laser being formed from a laser structure epitaxially deposited on a substrate selected from the group comprising InP, GaAs, and GaN. The hybrid assembly may still further comprise said base further including a stopper.

BRIEF DESCRIPTION OF THE DRAWINGS

The foregoing and additional objects, features and advantages of the present disclosure will become apparent to those of skill in the art from the following detailed description of the present disclosure taken with the accompanying drawings, which are briefly described as follows.

FIG. 8 (a) is a top view of a semiconductor laser with reflective angled sidewalls placed in front of the front facet; FIG. 8 (b) shows RSoft FDTD simulations of the intensity of light for the light exiting the front facet and being modified by the reflective sidewalls; and FIG. 8 (c) shows the horizontal far-field (HFF) modified by the reflective sidewalls in a solids line while the HFF corresponding to the laser without any reflective sidewalls is shown in dashed lines for reference.

FIG. 9 (a) is a top view of a semiconductor laser with reflective parallel sidewalls placed in front of the front facet; FIG. 9 (b) shows RSoft FDTD simulations of the intensity of light for the light exiting the front facet and being modified by the reflective sidewalls; and FIG. 9 (c) shows the HFF modified by the reflective sidewalls in a solids line while the HFF corresponding to the laser without any reflective sidewalls is shown in dashed lines for reference.

FIG. 12 (a) is a cross-section of a semiconductor laser with a front etched facet at an angle A from a perpendicular line to the plane of the substrate and back etched facet at or close to perpendicular to the substrate, with a flat patio of 10 μm adjacent the front facet, and FIG. 12 (b) contains the corresponding VFF for this structure in solid line obtained through RSoft FDTD simulations and the VFF from FIG. 1 (b) in dashed line for reference.

FIG. 13 (a) is a cross-section of a semiconductor laser with a front etched facet at an angle B from a perpendicular line to the plane of the substrate and back etched facet at or close to perpendicular to the substrate, with a flat patio of 10 μm adjacent the front facet, and FIG. 13 (b) contains the corresponding VFF for this structure in solid line obtained through RSoft FDTD simulations and the VFF from FIG. 1 (b) in dashed line for reference.

FIG. 14 (a) is a cross-section of a semiconductor laser with a front etched facet at an angle A from a perpendicular line to the plane of the substrate and back etched facet at or close to perpendicular to the substrate, with a staircase adjacent the front facet, where each step in the staircase is 0.6 μm in height and 2.5 μm in width, and FIG. 14 (b) contains the corresponding VFF for this structure in solid line obtained through RSoft FDTD simulations and the VFF from FIG. 1 (b) in dashed line for reference.

FIG. 15 shows a cross-sectional view of a cleaved facet laser mounted active-side down on a silicon base, the silicon base containing a staircase, and the laser is positioned so that the facet is adjacent to the silicon staircase.

FIG. 16 (a) is a cross-section of a semiconductor laser with both front and back facets formed through etching, with a staircase adjacent the front facet, a silicon base containing a staircase, and the laser is mounted active-side down on the silicon base and positioned so that the front facet is also adjacent to the silicon staircase, and FIG. 16 (b) contains the corresponding VFF for this structure in solid line obtained through RSoft FDTD simulations and the VFF from FIG. 1 (b) in dashed line for reference.

FIG. 17 (a) is a top view of a semiconductor laser with reflective curved sidewalls placed in front of the front facet; FIG. 17 (b) shows RSoft FDTD simulations of the intensity of light for the light exiting the front facet and being modified by the reflective sidewalls; and FIG. 17 (c) shows the HFF modified by the reflective sidewalls in a solids line while the HFF corresponding to the laser without any reflective sidewalls is shown in dashed lines for reference.

DETAILED DESCRIPTION OF EMBODIMENTS

Figure 1A:
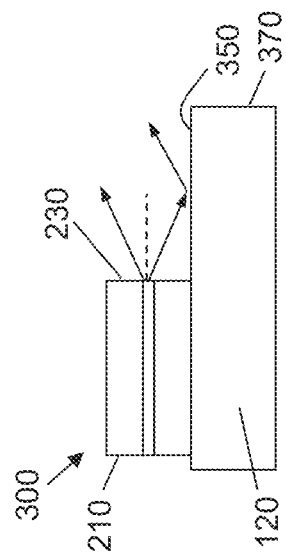
FIG. 1 (a) is a cross-section of a semiconductor laser with both front and back facets formed through cleaving, and FIG. 1 (b) is the corresponding vertical far-field (VFF) from either the front or back facets obtained through RSoft Finite-Difference Time-Domain (FDTD) simulations.
Figure 1B:
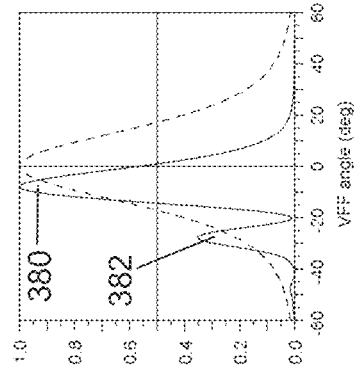

FIG. 1 (a) shows a semiconductor laser 100 formed through cleaving of the front 130 and back 110 facets. The laser structure comprises a substrate 120 with epitaxially deposited layers that allow the formation of a lower cladding layer 140, which may extend into the substrate or be completely epitaxially deposited as shown in FIG. 1 (a) and of thickness 1.83 μm, an active region 180 of 0.34 μm thickness, and an upper cladding layer 160 of 1.83 μm. The laser emits laser light at around 1310 nm. FIG. 1 (b) shows the vertical far-field (VFF) obtained through RSoft Finite-Difference Time-Domain (FDTD) simulations from either the front or back facet of the structure in FIG. 1 (a).

Figure 2A:
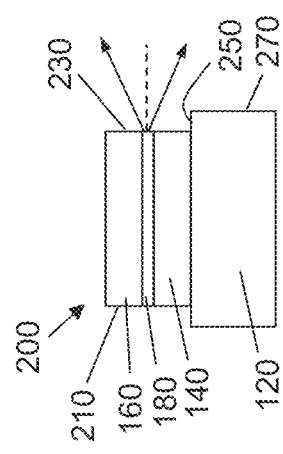
FIG. 2 (a) is a cross-section of a semiconductor laser with both front and back facets formed through etching, with a flat patio of 2 μm adjacent the front facet, and FIG. 2 (b) contains the corresponding VFF to this structure in solid line obtained through RSoft FDTD simulations and the VFF from FIG. 1 (b) in dashed line for reference.
Figure 2B:
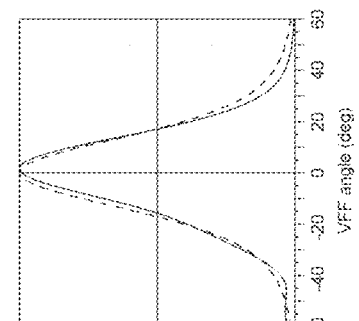

FIG. 2 (a) shows a cross-section of a semiconductor laser 200 formed through etching of the front 230 and back facets 210 at or close to perpendicular to the plane of the substrate 120, which is usually a deviation of the etched facet of up to 3° from the normal to the plane of the substrate. Examples of processes of forming etched facet lasers are described in U.S. patent application Ser. No. 11/356,203 or U.S. Pat. No. 8,130,806, both of which are assigned to the assignee of the present application and the disclosures of which is hereby incorporated by reference in its entirety. The etched facets are typically formed by etching through the upper cladding layer, the active region, and at least part of the lower cladding. The laser chip is singulated at 270 so that the patio 250 adjacent the front facet 230 is 2 μm wide (2 μm is the horizontal distance between the front facet and the singulation plane 270). FIG. 2 (b) shows the VFF obtained through RSoft FDTD simulations from the front facet in a solid line and the VFF from FIG. 1 (b) in dashed lines for reference. There is only a small difference between the two VFF curves.

Figure 3A:
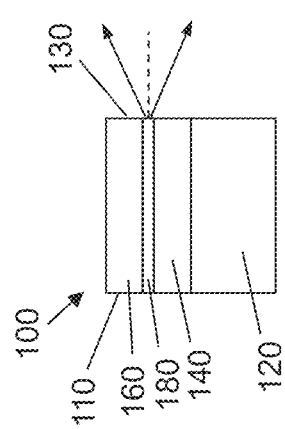
FIG. 3 (a) is a cross-section of a semiconductor laser with both front and back facets formed through etching, with a flat patio of 10 μm adjacent the front facet, and FIG. 3 (b) contains the corresponding VFF for this structure in solid line obtained through RSoft FDTD simulations and the VFF from FIG. 1 (b) in dashed line for reference.
Figure 3B:
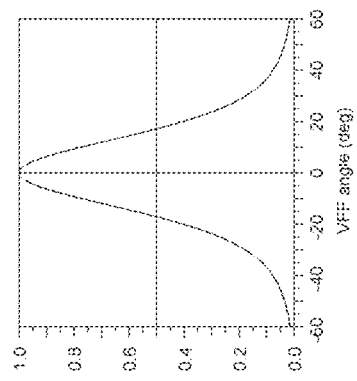

FIG. 3 (a) shows a cross-section of a semiconductor laser 300 formed through etching of the front 230 and back 210 facets. The laser chip is singulated at 370 so that the patio 350 adjacent the front facet 230 is 10 μm wide. FIG. 3 (b) shows the VFF obtained through RSoft FDTD simulations from the front facet in a solid line and the VFF from FIG. 1 (b) in dashed lines for reference. There is considerable difference between the two VFF curves. The VFF in the solid line shows a significant narrowing of its main lobe 380 full-width half-maximum (FWHM) compared to the dashed line. Furthermore, the VFF in the solid line shows a significant degree of beam pointing that is around 10° from the center and the presence of a side lobe 382. A narrow FWHM is very useful in, for example, allowing high coupling efficiency to an optical fiber. However, the beam pointing causes difficulty and incompatibility with most traditional approaches of packaging lasers and coupling to an optical fiber.

Figure 4:
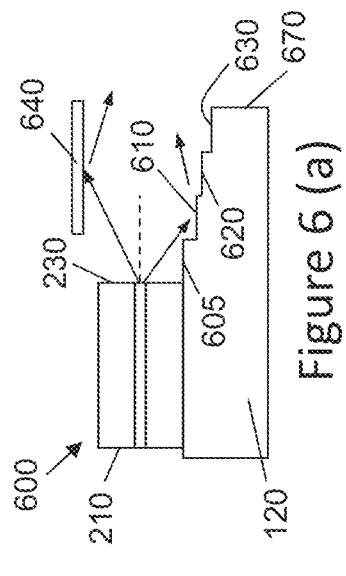
FIG. 4 (a) is a cross-section of a semiconductor laser with both front and back facets formed through etching, with a 10° tilted patio of length 10 μm adjacent the front facet, and FIG. 4 (b) contains the corresponding VFF for this structure in solid line obtained through RSoft FDTD simulations and the VFF from FIG. 1 (b) in dashed line for reference.

FIG. 4 (a) shows a cross-section of a semiconductor laser 400 formed through etching of the front 230 and back 210 facets. The laser chip is singulated at 470 so that the patio 450 adjacent to the front facet 230 is 10 μm wide, but the patio 450 is also titled at 10° downwards towards the substrate 120. FIG. 4 (b) shows the VFF obtained through RSoft FDTD simulations from the front facet in a solid line and the VFF from FIG. 1 (b) in dashed lines for reference. The VFF in the solid line shows a significant narrowing of the FWHM of its main lobe 480, compared to the dashed line. However, unlike in FIG. 3 (b), the main lobe 480 of the VFF in the solid line is centered and does not show any significant beam pointing. The narrow FWHM of the main lobe in the VFF and lack of beam-pointing is very useful in, for example, allowing high coupling efficiency to an optical fiber with traditional packaging of the semiconductor laser chip for coupling to an optical fiber. In general, the power in the side lobe 482 will not couple into an optical fiber, for example, as efficiently as the main lobe, and, as such, it is desirable to minimize the side lobe and maximize the main lobe for highest efficiency coupling, for example, to an optical fiber.

Figure 5:
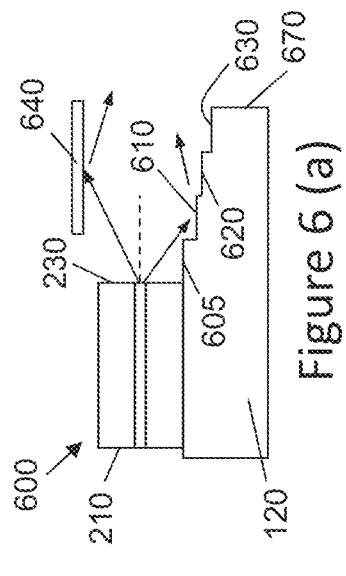
FIG. 5 (a) is a cross-section of a semiconductor laser with both front and back facets formed through etching, with a staircase adjacent the front facet, where each step in the staircase is 0.6 μm in height and 2.5 μm in width, and FIG. 5 (b) contains the corresponding VFF for this structure in solid line obtained through RSoft FDTD simulations and the VFF from FIG. 1 (b) in dashed line for reference.

FIG. 5 (a) shows a cross-section of a semiconductor laser 500 formed through etching of the front 230 and back 210 facets. The laser chip is singulated at 570 so that the staircase adjacent to the front facet is 10 μm wide. The staircase has a foot 505 and three flat steps, 510, 520, and 530, and the staircase goes downwards towards the substrate. The surface of step 510 is lower than the active region and at least part of the lower cladding layer at the etched front facet 230, the surface of step 520 is lower than 510, and the surface of step 530 is lower than 520. Each step is 2.5 μm in width and 0.6 μm in height. The foot 505 can be lower than the surface of step 510, however, it can only be slightly higher than step 510, so long as it does not interfere with the beam in any significant way. FIG. 5 (b) shows the VFF obtained through RSoft FDTD simulations from the front facet in a solid line and the VFF from FIG. 1 (b) in dashed lines for reference. The VFF in the solid line shows a significant narrowing of the FWHM of its main lobe 580 compared to the dashed line. As in FIG. 5 (b), the main lobe 580 of the VFF in the solid line is centered and does not show any significant beam pointing. Even a single step in the staircase has shown significant impact on eliminating the beam pointing. The side lobe 582 is reduced in intensity compared to 482.

Figure 6:
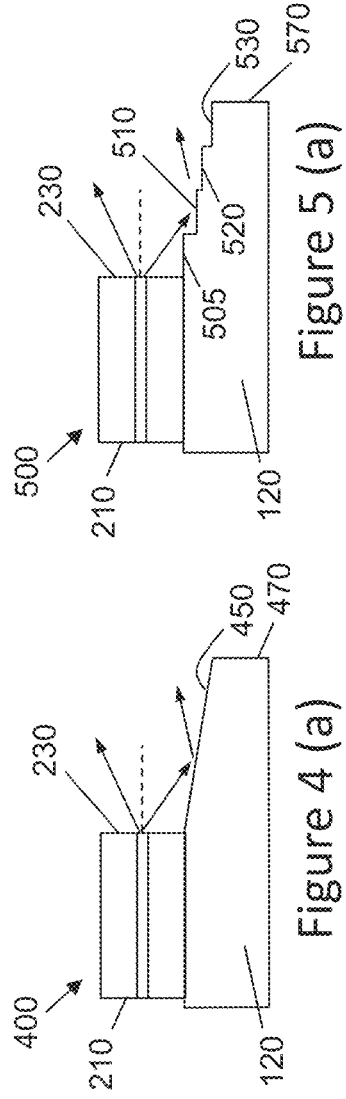
FIG. 6 (a) is a cross-section of a semiconductor laser with both front and back facets formed through etching, with a staircase adjacent the front facet, where each step in the staircase is 0.6 μm in height and 2.5 μm in width, and a 1 μm thick "roof" located above the staircase reflective to the laser light on the side of the roof facing the staircase, having a length of 3.75 μm, positioned such that in cross-section, the lower left corner of the roof is 4.75 μm above the edge of the first step, and FIG. 6 (b) contains the corresponding VFF for this structure in solid line obtained through RSoft FDTD simulations and the VFF from FIG. 1 (b) in dashed line for reference.
Figure 4:
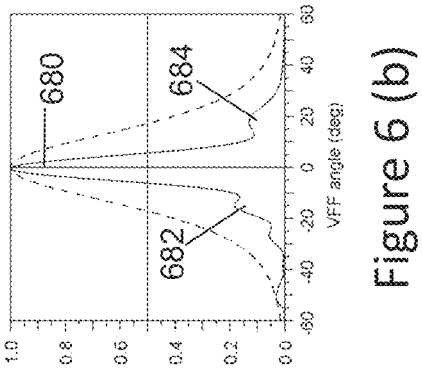
Figure 5:
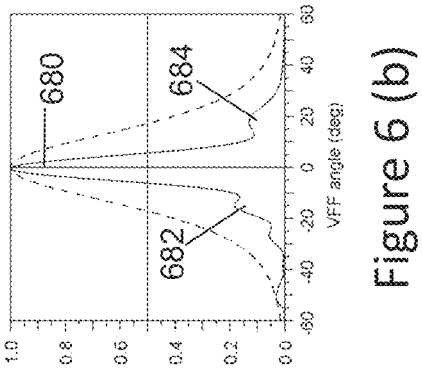
Figure 6:
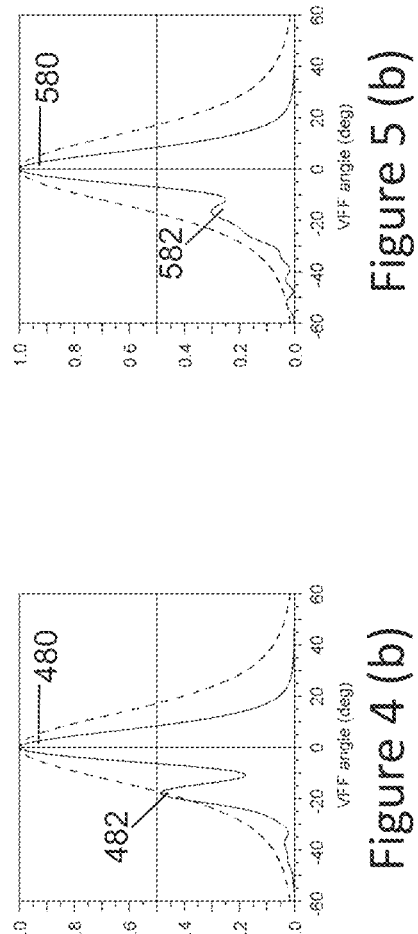

FIG. 6 (a) shows a cross-section of a semiconductor laser 600 formed through etching of the front 230 and back 210 facets. The laser chip is singulated at 670 so that the staircase adjacent to the front facet is 10 μm wide. The staircase has a foot 605 and three flat steps, 610, 620, and 630, and the staircase goes downwards towards the substrate. The surface of step 610 is lower than the active region and at least part of the lower cladding layer at the etched front facet 230, the surface of step 620 is lower than 610, and the surface of step 630 is lower than 620. Each step is 2.5 μm in width and 0.6 μm in height. In addition, a 1 μm thick roof 640 is located above the staircase that is reflective to the laser light on the side of the roof facing the staircase, having a length of 3.75 μm, positioned such that in cross-section, the lower left corner of the roof is 4.75 μm above the edge of the first step in the staircase. FIG. 6 (b) shows the VFF obtained through RSoft FDTD simulations from the front facet in a solid line and the VFF from FIG. 1 (b) in dashed lines for reference. The VFF in the solid line shows a significant narrowing of the FWHM of its main lobe 680 compared to the dashed line. As in FIGS. 4 (b) and 5 (b), the main lobe 680 of the VFF in the solid line is centered and does not show any significant beam pointing. However, more of the power is concentrated in the main lobe 680 and the side lobe 682 is further reduced compared to 482 and 582, although another small side lobe 684 is present.

Figure 7:
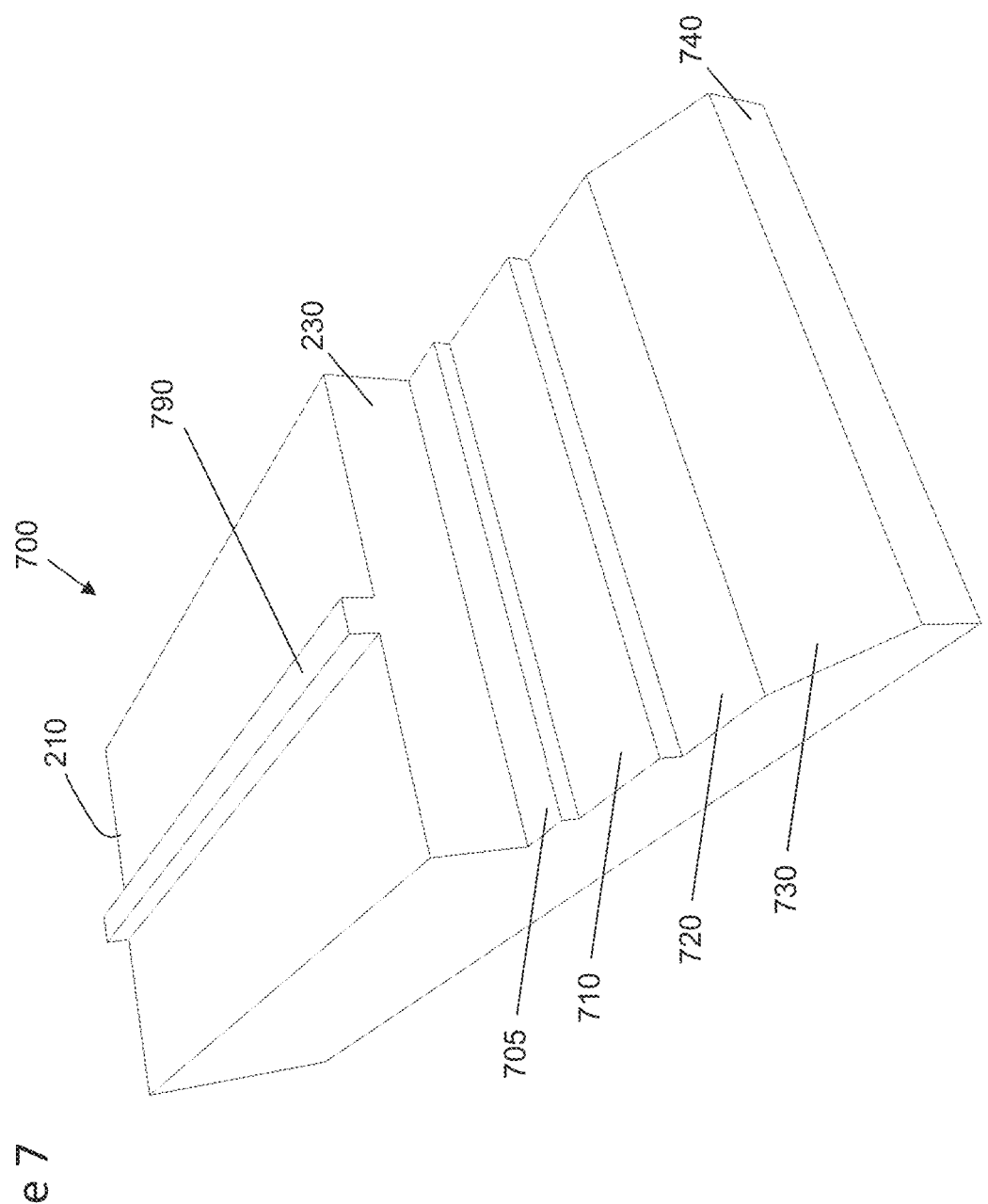
FIG. 7 shows a perspective view of a ridge laser front facet with a staircase adjacent to the front facet, used to control the beam vertically.

FIG. 7 shows a perspective view of a ridge laser 700 with the front facet 230 adjacent to a two-step staircase and a foot. The foot 705 is depicted as a first surface with its plane being the lowest point of the front etched facet 230. The first step 710 and second step 720 both have flat surfaces. A tilted surface 730 is present that is angled downwards towards the substrate. The chip is singulated at 740. Although a ridge 790 laser is depicted, it will be understood that other types of lasers may be fabricated utilizing the features described herein. For example, the laser structure can also be a buried heterostructure (BH) laser. The type of laser can, for example, be a Fabry Perot (FP) laser or a distributed feedback (DFB)

laser. The foot 705 can have a surface lower than the surface of step 710 however, it can only be slightly higher than step 710 so long as it does not interfere with the beam in any significant way. If the foot is fabricated as depicted in FIG. 7 with a smooth reflective surface, it may be used as the first step in the staircase.

In an experiment conducted, two types of ridge lasers were fabricated. Type 1 was of the kind shown in FIG. 2 (*a*), and Type 2 was as shown in FIG. 5 (*a*) with three steps in the staircase. As is conventional in the fabrication of solid state ridge lasers, the substrate may be formed, for example, of a type III-V compound, or an alloy thereof, which may be suitably doped. The substrate includes a top surface on which is deposited, as by an epitaxial deposition such as Metalorganic Chemical Vapor Deposition (MOCVD) or Molecular Beam Epitaxy (MBE), a succession of layers. The laser structure was a 1310 nm emitting epitaxial structure with the following layers on an InP substrate: n-InP lower cladding; AlGaInAs lower graded region; an active region containing compressively strained AlGaInAs quantum wells, each sandwiched by tensile strained AlGaInAs barriers; AlGaInAs upper graded region; p-InP upper cladding; and highly p-doped InGaAs cap layer. Wafer-level testing determined that the ridge laser electronic characteristics, such as threshold current, were very similar for Type 1 and 2 lasers. Type 1 and 2 lasers were packaged in a TO-56 can with a 1.5 mm lens of refractive index 1.496 without AR coating. The packaged lasers were coupled to an optical fiber at an optimal position and the slope efficiency (SE) in the fiber (the amount of coupled laser power in the fiber divided by the amount current above threshold applied to the laser diode) determined. The average SE in the fiber for Type 1 was 0.0737 W/A, while the average SE in the fiber for Type 2 was 0.0970 W/A, an increase in coupling efficiency due to the staircase adjacent the front facet of more than 31%.

FIG. 8 (*a*) shows a top view of a semiconductor laser 800 with a 2 μm wide ridge 790. This laser has a horizontal far-field (HFF) shown in FIG. 8 (*c*) with dashed lines obtained through RSoft FDTD simulations, when there are no features in front of the front-facet, as would be the case for FIG. 1 (*a*) or 2 (*a*). Reflective sidewalls 810 and 820 are placed in front of the front-etched-facet 230 at a gap 840 of 2 μm to allow electrical isolation between the laser and the reflective sidewalls. The sidewall structure has a length 860 of 13 μm. The reflective surface 810 is at an angle 830 of 75° to the plane of the front-etched-facet. The reflective surface 820 is at an angle 835 of 75° to the plane of the front-etched-facet. The gap 850 between the two reflective sidewalls is 6 μm at their closest point to the front etched facet. FIG. 8 (*b*) shows RSoft FDTD simulations of the ridge laser and the reflective sidewalls. FIG. 8 (*c*) shows the impact of the reflective sidewalls on the HFF in solid line and that the HFF has significantly narrowed over that of the laser without the reflective sidewalls. A narrower HFF from a semiconductor laser has many applications, including better coupling into an optical fiber.

FIG. 9 (*a*) shows a top view of a semiconductor laser 900 with a 2 μm wide ridge 790. This laser has a horizontal far-field (HFF) shown in FIG. 9 (*c*) with dashed lines obtained through RSoft FDTD simulations, when there are no features in front of the front-facet, as would be the case for FIG. 1 (*a*) or 2 (*a*). Reflective sidewalls 910 and 920 are placed in front of the front etched facet at a gap 940 of 2 μm to allow electrical isolation between the laser and the reflective sidewalls. The sidewall structure has a length 960 of 13 μm and the reflective surface 910 is at an angle 930 of 90° to the plane of the front etched facet. The reflective surface 920 is parallel to 910. The gap 950 between the two reflective sidewalls is 6 μm. FIG. 9 (*b*) shows RSoft FDTD simulations of the ridge laser and the reflective sidewalls. FIG. 9 (*c*) shows the impact of the reflective sidewalls on the HFF in solid line and that two district lobes have been formed as a result of the sidewalls. Splitting a laser beam into two or more lobes has many applications, such as providing light to two or more waveguides, respectively.

Figure 10:
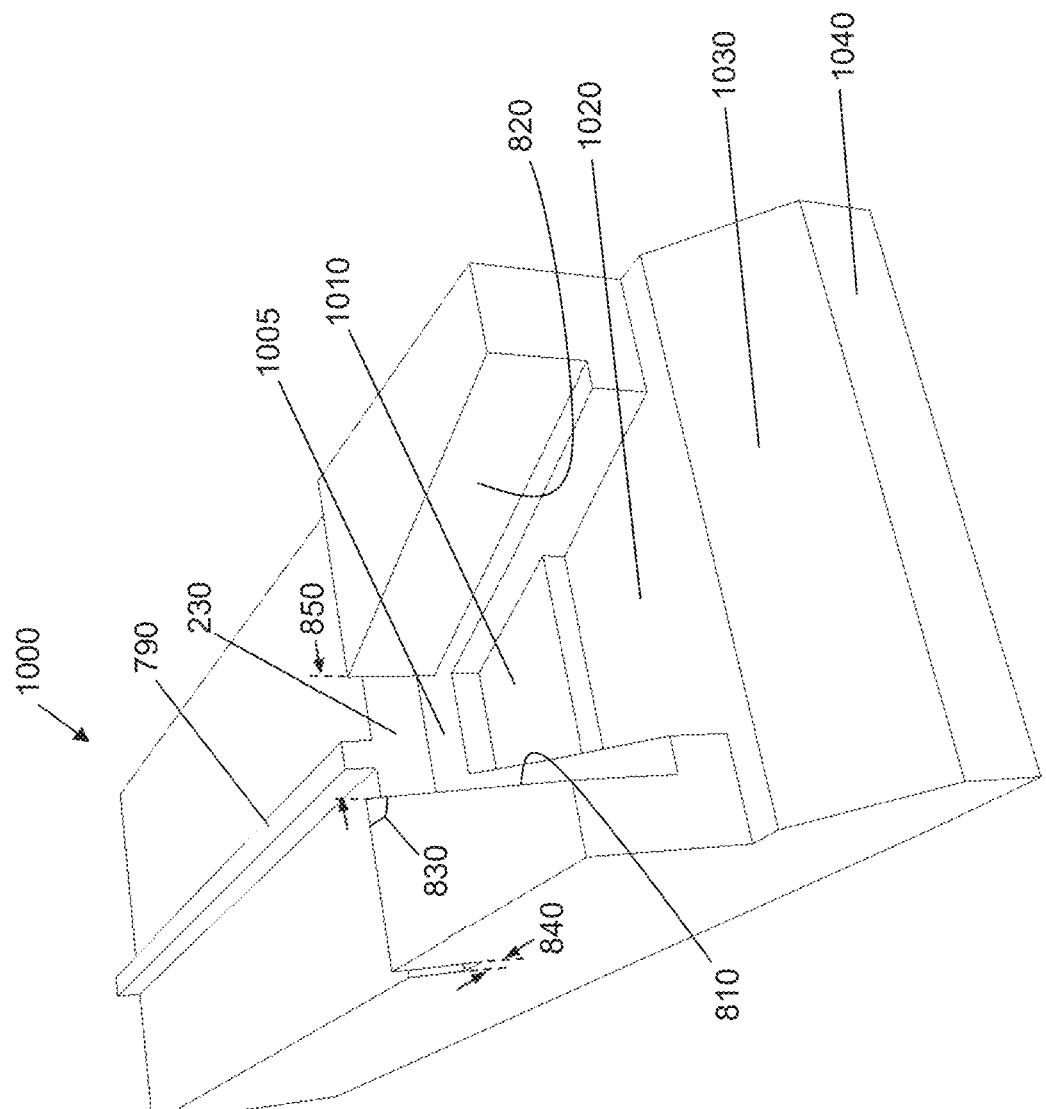
FIG. 10 shows a perspective view of a ridge laser front facet with a staircase of a foot and three steps adjacent to the front facet, the first and second step being flat, while the third being flat and then tilted towards the substrate, used to control the beam vertically as in FIG. 5 (a), but also including sidewalls similar to that in FIG. 8 that are used for control the beam in the horizontally.

FIG. 10 shows a perspective view of a ridge laser 1000 front facet 230 with a staircase of two steps and a foot adjacent to the front facet 230. The first flat surface is a foot 1005 defined by the lowest point of the front etched facet 230. The first step 1010 and second step 1020 have flat surfaces. A tilted surface 1030 angled downwards towards the substrate and the chip is singulated at 1040. The structure includes reflective sidewalls 810 and 820. The staircase structure allow more of the laser light power from the front etched facet to remain along a line extending from the ridge and parallel to the ridge 790, and as such the impact of the reflective sidewalls 810 and 820 is more pronounced than could be the case, for example, of the structure in FIG. 3 (*a*). The foot 1005 can have a surface lower than the surface of step 1010, however, it can only be slightly higher than step 1010, so long as it does not interfere with the beam in any significant way. If the foot is designed as depicted in FIG. 10 as having a smooth reflective surface, it may be used as the first step in the staircase.

In order to form the reflective surfaces for the sidewalls 810 and 820, sputtering of a reflective metal is used with a lift-off process. Alternatively, evaporated metal is used with a lift-off process, but the substrate is rocked during evaporation to allow good coverage on the sidewalls 810 and 820, as well as the flat surface 1010 and 1020. It will be understood that other types of reflective films can be deposited on the sidewalls.

Figure 11:
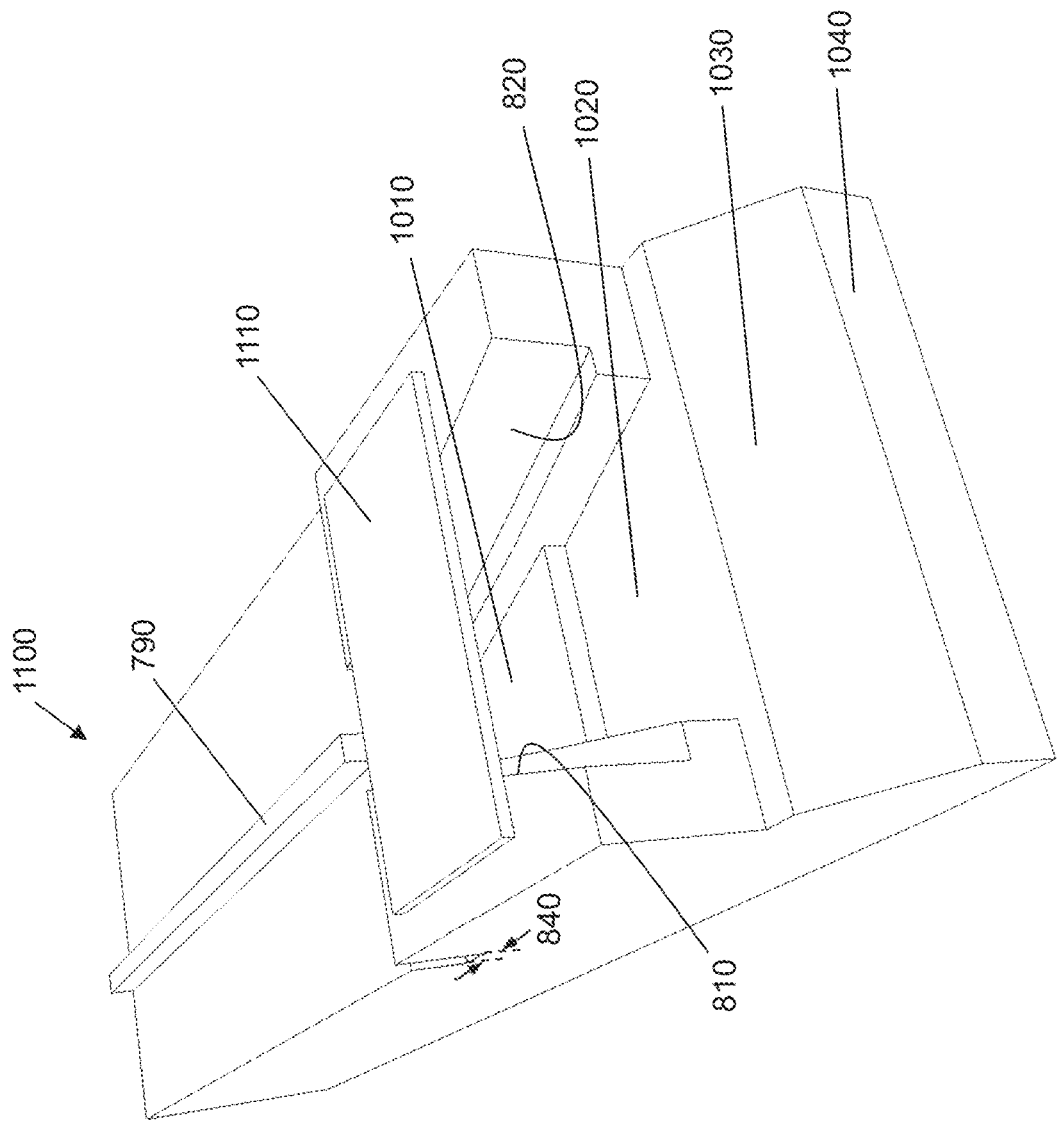
FIG. 11 shows a perspective view of a ridge laser front facet with a staircase and a roof, used to control the beam vertically as in FIG. 6 (a), but also including sidewalls similar to that in FIG. 8 that are used for control the beam in the horizontally.

FIG. 11 shows a perspective view of a laser 1100, identical to FIG. 10, but including a roof 1110 to further concentrate laser light power in the main lobe and reduce the side lobe, as discussed above when describing FIGS. 6 (*a*) and (*b*). The roof is deposited from a reflective material, such as a metal, and using a process similar to that used in forming metal bridges in semiconductors (see, for example, http://www.microchem.com/Appl-IIIVs-Airbridges.htm).

FIG. 12 (*a*) shows a cross-section of a semiconductor laser 1200 formed through etching of the front facet 1230 at an angle A of 10° to the normal to the plane of the substrate and etching of the back facet 210 at or close to perpendicular to the plane of the substrate. The laser chip is singulated at 370 so that the patio 350 adjacent the front facet 1230 is 10 μm wide. FIG. 12 (*b*) shows the VFF obtained through RSoft FDTD simulations from the front facet in a solid line and the VFF from FIG. 1 (*b*) in dashed lines for reference. There is considerable difference between the two VFF curves. The VFF in the solid line shows a significant narrowing of the FWHM of its main lobe 1280 compared to the dashed line. Furthermore, the VFF in the solid line shows a significant degree of beam pointing that is around 10° from the center and the presence of a side lobe 1282. The side lobe 1282 is larger than side lobe 382.

FIG. 13 (*a*) shows a cross-section of a semiconductor laser 1300 formed through etching of the front facet 1330 at an angle B of 10° to the normal to the plane of the substrate and etching of the back facet 210 at or close to perpendicular to the plane of the substrate. The laser chip is singulated at 370 so that the patio 350 adjacent the front facet 1330 is 10 μm wide. FIG. 13 (*b*) shows the VFF obtained through RSoft FDTD simulations from the front facet in a solid line and the VFF from FIG. 1 (*b*) in dashed lines for reference. There is considerable difference between the two VFF curves. The VFF in the solid line shows a significant narrowing of the FWHM of its main lobe 1380 compared to the dashed line. Furthermore, the VFF in the solid line shows a significant degree of beam pointing that is around 10° from the center and the presence of a side lobe 1382. The side lobe 1382 is larger than side lobe 382.

FIG. 14 (*a*) shows a cross-section of a semiconductor laser 1400 formed through etching of the front 1230 at an angle A of 10° to the normal to the plane of the substrate and etching of the back 210 facet at or close to perpendicular to the plane of the substrate. The laser chip is singulated at 570 so that the staircase adjacent to the front facet is 10 µm wide. The staircase has a foot 505 and three flat steps, 510, 520, and 530, and the staircase goes downwards towards the substrate. Step 510 is lower than the active region and at least part of the lower cladding layer at the etched front facet 1430, the surface of step 520 is lower than 510, and the surface of step 530 is lower than 520. Each step is 2.5 µm in width and 0.6 µm in height. The foot 505 can be lower than the surface of step 510, however, it can only be slightly higher than step 510 so long as it does not interfere with the beam in any significant way. FIG. 14 (*b*) shows the VFF obtained through RSoft FDTD simulations from the front facet in a solid line and the VFF from FIG. 1 (*b*) in dashed lines for reference. The VFF in the solid line shows a significant narrowing of its main lobe 1480 FWHM compared to the dashed line. As seen in FIG. 14 (*b*), the main lobe 1480 of the VFF in the solid line is centered and does not show any significant beam pointing. Even a single step in the staircase has shown significant impact on eliminating the beam pointing. The side lobe 1482 is reduced in intensity compared to 482.

FIG. 15 shows a cross-sectional view of a hybrid assembly 1500 of the cleaved facet laser of FIG. 1 (*a*) mounted active-side down on a silicon substrate or base. Other type of substrates or base materials, such as AlN can be substituted for the silicon base. The silicon base is cut or singulated at 1575. The silicon base contains a downward staircase structure. The staircase structure depicted in FIG. 15 shows a foot 1505 and three steps 1510, 1520, and 1530, where step 1510 is higher than 1520, and step 1520 is higher than step 1530. Each step is 2.5 µm in width and 0.6 µm in height. The foot 1505 can be lower than the surface of step 1510, however, it can only be slightly higher than step 1510 so long as it does not interfere with the beam in any significant way. The cleaved facet laser is carefully positioned so that the facet is adjacent to the silicon staircase so that so that the staircase adjacent to the front facet is 10 µm wide. A VFF similar to that of the solid line in FIG. 5 (*b*) is obtained through RSoft FDTD simulations. The silicon base may further incorporate a stopper 1590 that allows the cleaved facet laser to be positioned with high accuracy on the silicon base.

FIG. 16 (*a*) shows a cross-sectional view of a hybrid assembly 1600 of the etched facet laser of FIG. 5 (*a*) mounted active-side down on a silicon base. The silicon base is cut or singulated at 1575. The silicon base contains a downward staircase structure. The staircase structure depicted in FIG. 16 (*a*) shows a foot 1505 and three steps 1510, 1520, and 1530, where step 1510 is higher than 1520, and step 1520 is higher than step 1530. Each step is 2.5 µm in width and 0.6 µm in height. The foot 1505 can be lower than the surface of step 1510, however, it can only be slightly higher than step 1510 so long as it does not interfere with the beam in any significant way. The laser chip is singulated at 570 so that the staircase adjacent to the front facet is 10 µm wide. The staircase has a foot 505 and three flat steps, 510, 520, and 530, and the staircase goes downwards towards the substrate 120. The surface of step 510 is lower than the active region and at least part of the lower cladding layer at the etched front facet 230, the surface of step 520 is lower (towards substrate 120) than 510, and the surface of step 530 is lower (towards substrate 120) than 520. Each step is 2.5 µm in width and 0.6 µm in height. The foot 505 can be lower than the surface of step 510 however, it can only be slightly higher than step 510, but so long as it does not interfere with the beam in any significant way. The etched facet laser is carefully positioned so that the facet is adjacent to the silicon staircase so that so that the silicon staircase adjacent to the front facet is about 10 µm wide. FIG. 16 (*b*) shows the VFF obtained through RSoft FDTD simulations from the front facet in a solid line and the VFF from FIG. 1 (*b*) in dashed lines for reference. The VFF in the solid line shows a significant narrowing of its main lobe 1680 FWHM compared to the dashed line. As seen in FIG. 16 (*b*), the main lobe 1680 of the VFF in the solid line is centered and does not show any significant beam pointing. The side lobe 1682 is reduced in intensity compared to 482. Another small side lobe 1684 is present.

FIG. 17 (*a*) shows a top view of a semiconductor laser 1700 with a 2 µm wide ridge 790. This laser has a horizontal far-field (HFF) shown in FIG. 17 (*c*) with dashed lines obtained through RSoft FDTD simulations, when there are no features in front of the front-facet, as would be the case for FIG. 1 (*a*) or 2 (*a*). Reflective curved sidewalls 1710 and 1720 are placed in front of the front etched facet at a gap 1740 of 6 µm to allow electrical isolation between the laser and the reflective sidewalls. The curved sidewall structure has a length 1760 of 4 µm and a radius of curvature of 3 µm with gap 1750 of 7 µm. FIG. 17 (*b*) shows RSoft FDTD simulations of the ridge laser and the reflective sidewalls. FIG. 17 (*c*) shows the impact of the reflective sidewalls on the HFF in solid line and that the HFF has narrowed over that of the laser without the reflective sidewalls. This illustrates that many shapes of sidewalls are possible beyond simple straight ones.

Devices with angled etched front facets, such as those depicted in FIGS. 12 (*a*), 13 (*a*), and 14 (*a*), have their facet angled such that a laser beam impinges on the front facet at an angle below the critical angle of the front facet. This allows at least partial transmission from these facets. DFB lasers with antireflection coated angled front facets perform particularly well with this approach.

Prior art devices using semiconductor laser with spot size converters (SSC) allowed the emitted beam from the laser to have a shape that was modified. However, the incorporation of the SSC came at the loss of laser performance. For example, a laser with a SSC would have a threshold current that was higher than the same laser without the SSC. One of the beneficial characteristics of the present disclosure is that the laser threshold current is not impacted in any significant way when the staircase, roof, or sidewalls are added to the laser. The modification of the beam shape allows several benefits, for example, higher coupling efficiency to an optical fiber or an optical waveguide, or expanded tolerance for optical alignment.

Although, for example, laser 200 has been described as having its back facet 210 formed through etching, it will be understood that the back facet could alternatively be formed through cleaving.

When the angle of the surface 730 or 1030 is around 45° or higher towards the substrate, it does not contribute in the control or modification of the laser beam in any significant way, however, it can significantly increase the tolerance in singulation position, that is, the distance between the plane of 740 and that of the plane of front-etched-facet 230 can have a larger tolerance and make the singulation process easier to carry out.

The different depth levels of each flat surface of a step in the staircase structure are defined with high accuracy through epitaxial growth. In the case of InP based laser, epitaxial material is grown by alternating two materials which have wet-etch selectivity relative to each other, for example a 0.58 μm layer of InP alternating with a thin layer of around 0.02 μm of InGaAs or InGaAsP. The two-layers are repeated to the extent that steps are desired in the staircase structure. They are typically n-type doped. An n-type lower cladding, undoped active region, p-type upper cladding, and a highly p-type contact layer are subsequently deposited on top of these layers.

After fabricating the etched facet and the ridge, the staircase structure in front of the laser is formed by a sequence of lithographical mask definition with photoresist or dielectric followed by a layer-specific wet chemical etching, for example 1:4 HCl—$H_3PO_4$ for InP etching and 1:1:10 $H_2SO_4$:$H_2O_2$:$H_2O$ for InGaAs or InGaAsP etching.

Single longitudinal mode lasers are more desirable than multi-longitudinal mode lasers in many applications. One such application is in data communications where longer reaches of communications are obtained with a single longitudinal mode lasers compared to a multi-longitudinal laser. As discussed above, a DFB laser with one or more of the following: the staircase, roof, and the reflective sidewalls, allow the beam shape from the laser to be modified. U.S. Pat. No. 7,835,415, assigned to the assignee of the present application and the disclosure of which is hereby incorporated by reference in its entirety, teaches an alternative single longitudinal laser that can be used in conjunction with the present disclosure for laser beam control.

Semiconductor lasers with high VFF values, such as greater than 40°, can be designed to have lower threshold currents, which is desirable. However, typically, these lasers have poor coupling to, for example, optical fibers. The present disclosure allows for low threshold current benefits of a high VFF, while allowing good coupling efficiency.

Although the present disclosure was described in terms of a 1310 nm emitting InP based laser, it will be understood that other wavelengths on laser structures on InP, as well as other wavelength lasers on other substrates, such as violet, blue, and green on laser structures on GaN substrates and infrared and red on lasers structures on GaAs substrates can also benefit from the present disclosure.

Although the present disclosure has been illustrated in terms of preferred embodiments, it will be understood that variations and modifications may be made without departing from the true spirit and scope thereof as set out in the following claims.

The invention claimed is:

1. A semiconductor chip, comprising:
a substrate having a surface; and
an epitaxial laser on the surface of said substrate, said epitaxial laser having an etched facet;
wherein said substrate extends outwardly from said etched facet to form a patio comprising an exposed reflective surface and a plurality of steps formed therein, wherein each subsequent step outwardly from said etched facet extends further into said substrate in a direction substantially normal to the surface of said substrate such that light emitted from said laser is reflected off the exposed reflective surface of at least one of the plurality of steps to modify a vertical far field of said laser, and wherein each of said plurality of steps is clear of obstacles that may interfere with said light emitted from said laser.

2. The semiconductor chip of claim 1, further comprising at least one reflective sidewall extending outwardly from said etched facet, each sidewall having a reflective surface substantially perpendicular to a surface plane of said patio.

3. The semiconductor chip of claim 2, further comprising a roof disposed opposite from said patio extending outwardly from said etched facet, said roof having a reflective surface opposing the surface of said patio.

4. The semiconductor chip of claim 1, further comprising a reflective coating deposited on said patio.

5. The semiconductor chip of claim 1, wherein said substrate is selected from the group comprising InP, GaAs, and GaN.

6. A semiconductor chip, comprising:
a substrate;
an epitaxial laser on said substrate, said epitaxial laser having an etched facet;
a patio extending outwardly from said etched facet, said patio having an exposed reflective surface and a plurality of steps formed therein, each subsequent step outwardly from said etched facet extending further into said substrate; and
a roof extending outwardly from said etched facet, said roof having an exposed reflective surface opposing said reflective surface of said patio;
wherein light emitted from said laser is reflected off the exposed reflective surfaces of said roof and at least one of the plurality of steps to modify a vertical far field of said laser.

7. The semiconductor chip of claim 6, further comprising at least one reflective sidewall extending outwardly from said etched facet, each sidewall having a reflective surface substantially perpendicular to said reflective surface of said patio.

8. The semiconductor chip of claim 6, wherein said substrate is selected from the group comprising InP, GaAs, and GaN.

9. A semiconductor chip, comprising:
a substrate;
an epitaxial laser on a surface of said substrate, said epitaxial laser having an etched facet, said etched facet having a surface at an angle other than 90° to said surface of said substrate such that a laser beam generated by said epitaxial laser impinges on said etched facet below a critical angle of said etched facet; and
a structure adjacent said etched facet, said structure having at least two opposing reflective surfaces extending outwardly from said etched facet.

10. The semiconductor chip of claim 9, wherein said structure further comprises a tilted patio having a reflective surface.

11. The semiconductor chip of claim 10, wherein said at least two opposing reflective surfaces comprises at least two reflective sidewalls, each sidewall having a reflective surface substantially perpendicular to said reflective surface of said patio.

12. The semiconductor chip of claim 11, wherein each sidewall is separated from said etched facet with a gap.

13. The semiconductor chip of claim 9, wherein said structure further comprises a staircase containing a plurality of steps having reflective surfaces, each subsequent step outwardly from said etched facet extending further into said substrate.

14. The semiconductor chip of claim 13, wherein said at least two opposing reflective surfaces comprises at least two reflective sidewalls, each sidewall having a reflective surface substantially perpendicular to said reflective surfaces of said steps.

15. The semiconductor chip of claim 14, wherein each sidewall is separated from said etched facet with a gap.

16. The semiconductor chip of claim 9, wherein said substrate is selected from the group comprising InP, GaAs, and GaN.

17. A hybrid assembly, comprising:
a base with an exposed reflective surface of a patio having a downwards staircase with a plurality of steps, each subsequent step extending further into said base; and
a laser with an active layer and at least one etched facet, wherein said laser is mounted on said base;
wherein said at least one facet is positioned adjacent to said exposed reflective surface such that light emitted from said laser is reflected off the exposed reflective surface of at least one of the plurality of steps to modify a vertical far field of said laser, and wherein each of said the plurality of steps is clear of obstacles that may interfere with said light emitted from said laser.

18. The hybrid assembly of claim 17, wherein said base is either AlN or Si.

19. The hybrid assembly of claim 17, further comprising a reflective structure adjacent said etched facet.

20. The hybrid assembly of claim 17, wherein said laser is formed from a laser structure epitaxially deposited on a substrate selected from the group comprising InP, GaAs, and GaN.

21. The hybrid assembly of claim 17, wherein said base further includes a stopper against which said laser is positioned on said base.

* * * * *